US011528832B2

(12) United States Patent
Huang et al.

(10) Patent No.: US 11,528,832 B2
(45) Date of Patent: Dec. 13, 2022

(54) ELECTRONIC DEVICE

(71) Applicant: InnoLux Corporation, Miao-Li County (TW)

(72) Inventors: Wan-Ling Huang, Miao-Li County (TW); Tzu-Yuan Lin, Miao-Li County (TW); Geng-Fu Chang, Miao-Li County (TW); Chun-Hsien Lin, Miao-Li County (TW); Shu-Ming Kuo, Miao-Li County (TW); Jui-Feng Ko, Miao-Li County (TW); Tsau-Hua Hsieh, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 52 days.

(21) Appl. No.: 17/180,878

(22) Filed: Feb. 22, 2021

(65) Prior Publication Data

US 2021/0298210 A1    Sep. 23, 2021

Related U.S. Application Data

(60) Provisional application No. 62/991,040, filed on Mar. 17, 2020.

(30) Foreign Application Priority Data

Nov. 6, 2020    (CN) .......................... 202011232549.5

(51) Int. Cl.
*H05K 7/20*    (2006.01)
*H05K 1/18*    (2006.01)
(Continued)

(52) U.S. Cl.
CPC ......... *H05K 7/20963* (2013.01); *H05K 1/147* (2013.01); *H05K 1/189* (2013.01); *H05K 5/0021* (2013.01); *H05K 7/20509* (2013.01); *H05K 7/20972* (2013.01); *H05K 2201/10128* (2013.01)

(58) Field of Classification Search
None
See application file for complete search history.

(56) References Cited

U.S. PATENT DOCUMENTS

| 10,278,312 B1 | 4/2019 | Davis |
| 2008/0123272 A1* | 5/2008 | Kang ................. H05K 7/20972 |
| | | 361/679.01 |

(Continued)

FOREIGN PATENT DOCUMENTS

| CN | 109156090 A | 1/2019 |
| WO | 2015192424 A1 | 12/2015 |

*Primary Examiner* — Mukundbhai G Patel
(74) *Attorney, Agent, or Firm* — Winston Hsu

(57) ABSTRACT

An electronic device is provided, which is for coupling to another electronic device in a side-by-side manner, and the electronic device includes a substrate, a first thermal dissipation sheet and a thermal dissipation element. The substrate includes a first surface and a second surface. The first thermal dissipation sheet is disposed on the first surface. The thermal dissipation element is disposed on the substrate. The first thermal dissipation sheet is disposed between the thermal dissipation element and the substrate, and the thermal dissipation element at least partially overlaps the first thermal dissipation sheet.

19 Claims, 10 Drawing Sheets

(51) Int. Cl.
    *H05K 5/00*        (2006.01)
    *H05K 1/14*        (2006.01)

(56) References Cited

U.S. PATENT DOCUMENTS

2015/0169277 A1* 6/2015 Kim .................. H05K 7/20963
                                                      345/1.3
2019/0014402 A1* 1/2019 Ahn ..................... H01L 51/529

* cited by examiner

ELECTRONIC DEVICE

CROSS REFERENCE TO RELATED APPLICATION

This patent application claims the benefit of U.S. provisional application No. 62/991,040, filed Mar. 17, 2020, and the entire contents of which are incorporated herein by reference.

BACKGROUND OF THE DISCLOSURE

1. Field of the Disclosure

The present disclosure relates to an electronic device, and more particularly to an electronic device with a thermal dissipation element.

2. Description of the Prior Art

Common electronic devices nowadays usually have a display panel, and the information can be provided to users through the display panel. The light emitting elements in the display panel may generate heat and the lifetime of the light emitting elements may be shortened when the heat generated by the light emitting elements accumulates too much, resulting in the decrease in the brightness of the display panel. In addition, the brightness of the light emitting elements at different positions may not be uniform when the accumulated heat in the display panel is not uniformly distributed, resulting in the decrease in the display effect of the display panel.

SUMMARY OF THE DISCLOSURE

To solve the problems described above, the present disclosure provides an electronic device for coupling to another electronic device in a side-by-side manner, and the electronic device includes a substrate, a first thermal dissipation sheet and a thermal dissipation element. The substrate includes a first surface and a second surface opposite to the first surface. The first thermal dissipation sheet is disposed on the first surface. The thermal dissipation element is disposed on the substrate. The first thermal dissipation sheet is disposed between the thermal dissipation element and the substrate, and the thermal dissipation element at least partially overlaps the first thermal dissipation sheet.

These and other objectives of the present disclosure will no doubt become obvious to those of ordinary skill in the art after reading the following detailed description of the embodiment that is illustrated in the various figures and drawings.

DETAILED DESCRIPTION

Figure 1:
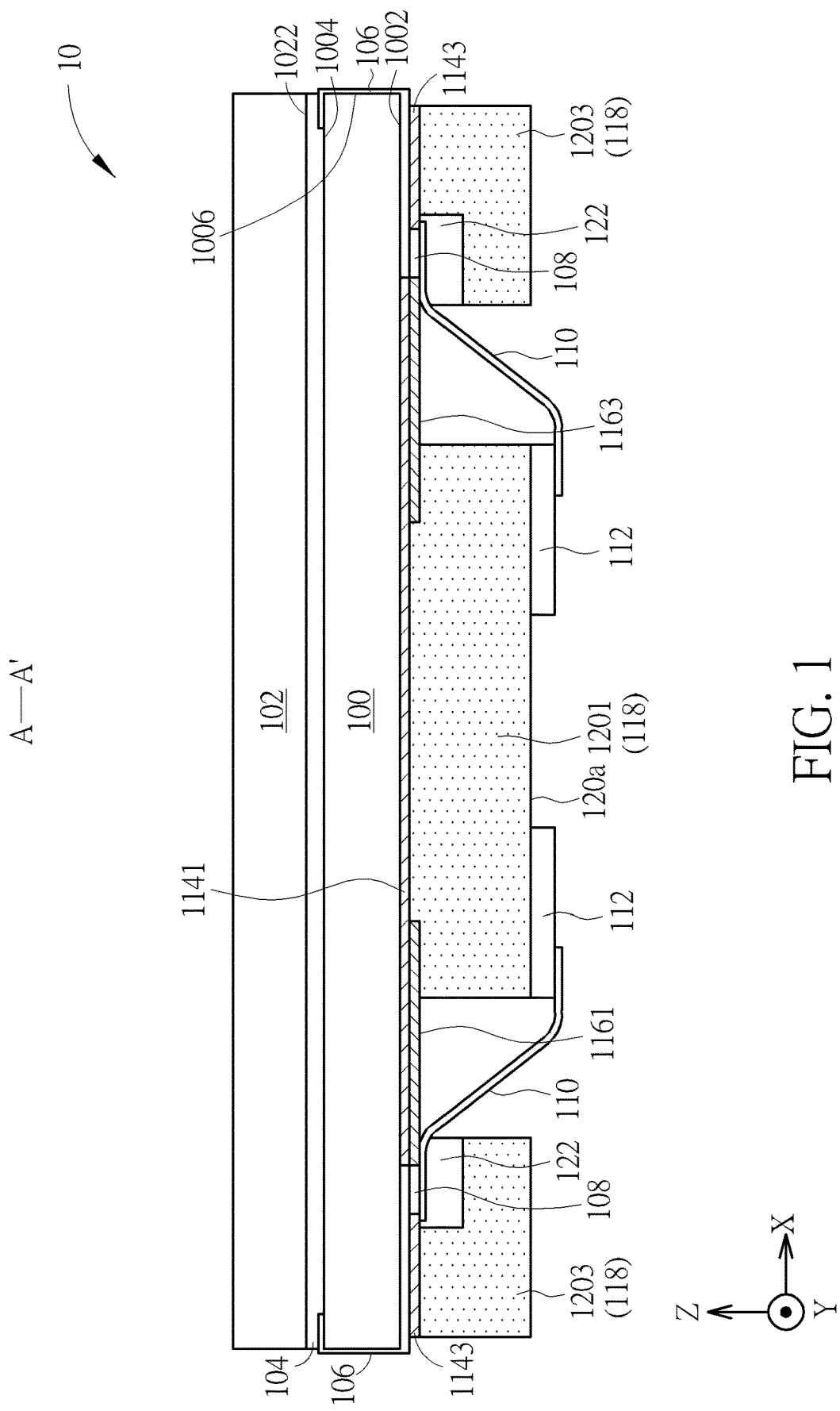
FIG. 1 is a sectional-view schematic diagram of an electronic device of a first embodiment according to the present disclosure.

The present disclosure may be understood by reference to the following detailed description, taken in conjunction with the drawings as described below. It is noted that, for purposes of illustrative clarity and being easily understood by the readers, various drawings of the present disclosure show a portion of the electronic device, and certain elements in various drawings may not be drawn to scale. In addition, the number and dimension of each element shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ".

It should be understood that when an element or layer is referred to as being "on", "disposed on" or "connected to" another element or layer, it may be directly on or directly connected to the other element or layer, or intervening elements or layers may be presented (indirect condition), or it may be directly connected to a surface of the other element.

For example, when an element or layer is referred to as being "on", "disposed on" or "connected to" another element or layer, it should not be limited by the normal direction of the substrate, but may also be disposed in the reverse direction of the normal direction or in the horizontal direction. In addition, the disposing relationship between different elements may be explained according to the contents of the drawings.

In addition, when an element or layer is referred to as being "directly on", "directly disposed on" or "directly connected to" another element or layer, there are no intervening elements or layers presented.

It should be understood that when an element or layer is referred to as being "between" two other elements or layers, it is not limited that the element or layer needs to be entirely located between the other two elements or layers, and it may also be that a portion of the element or layer is located between the other two elements or layers.

The electrical connection may be direct connection or indirect connection. When two elements are electrically connected, the electrical signals may be transmitted by direct contact, and there are no other elements presented between the two elements. When two elements are electrically connected, the electrical signals may be transmitted through the intermediate element bridging the two elements. The term "electrically connecting" may also be referred to as "coupling".

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

The electronic device of the present disclosure may, for example, include a display device, an antenna device, a touch display, a curved display or a free shape display, but not limited herein. The electronic device may be a bendable or flexible electronic device. The electronic device may include light-emitting diodes, liquid crystal, fluorescence, phosphors, other suitable display media or combinations of the above, but not limited herein. The light-emitting diodes may, for example, include organic light-emitting diodes (OLEDs), inorganic light-emitting diodes (LEDs), mini-light-emitting diodes (mini LEDs, millimeter sized LEDs), micro-light-emitting diodes (micro-LEDs, micrometer sized LEDs), quantum dots (QDs) light-emitting diodes (e.g. QLEDs or QDLEDs), other suitable light-emitting diodes or any combination of the above, but not limited herein. The display device may, for example, include a tiled display device, but not limited herein. The concept or principle of the present disclosure may also be applied to non-self-emissive liquid crystal display (LCD), but not limited herein.

The antenna device may be, for example, a liquid crystal antenna or other types of antennas, but not limited herein. The antenna device may, for example, include a tiled antenna device, but not limited herein. It should be noted that, the electronic device may also be any combination of the devices describe above, but not limited herein. In addition, the appearance of the electronic device may be rectangular, circular, polygonal, a shape with curved edges or other suitable shapes. The electronic device may have external systems such as a driving system, a control system, a light source system, a shelf system, etc. to support a display device, an antenna device or a tiled device. In the following, a display device will be used as the electronic device to illustrate the contents of the present disclosure, but the present disclosure is not limited herein.

A direction X, a direction Y and a direction Z are labeled in the following drawings. The direction Z may be perpendicular to a substrate 100 or a substrate 102, and the direction X and the direction Y may be parallel to the substrate 100 or the substrate 102. The direction Z may be perpendicular to the direction X and the direction Y, and the direction X may be perpendicular to the direction Y. The following drawings may describe the spatial relationship of structures according the direction X, the direction Y and the direction Z.

Figure 2A:
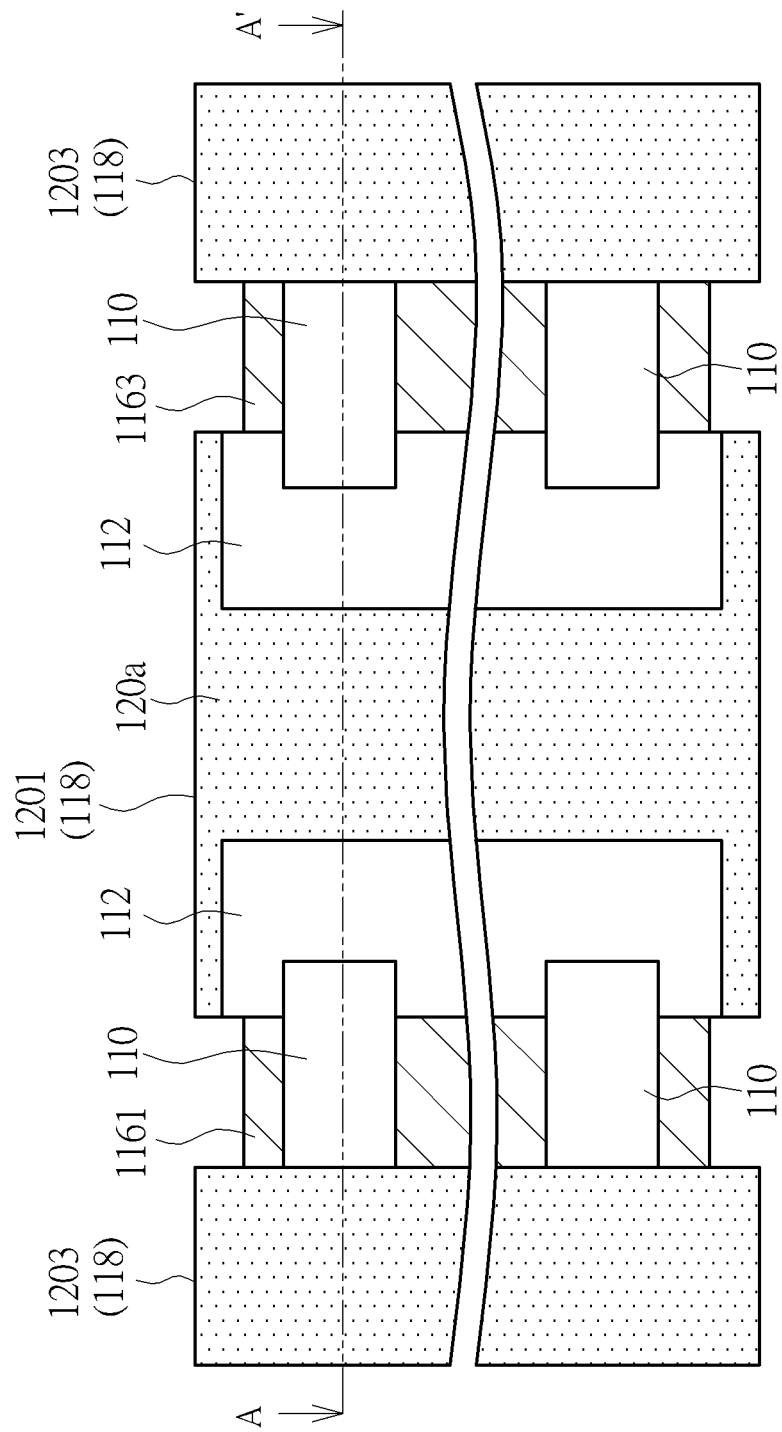
FIG. 2A is a top-view schematic diagram of the electronic device of the first embodiment according to the present disclosure.

Please refer to FIG. 1 and FIG. 2A. FIG. 1 is a sectional-view schematic diagram of an electronic device of a first embodiment according to the present disclosure. FIG. 2A is a top-view schematic diagram of the electronic device of the first embodiment according to the present disclosure, wherein the structure of FIG. 1 corresponds to the section line A-A' of FIG. 2A. The electronic device 10 in FIG. 1 may be a unit in a tiled electronic device, and the electronic device 10 may be coupled to another electronic device 10 in a side-by-side manner. For example, the tiled electronic device may include a plurality of electronic devices 10, and these electronic devices 10 may be arranged side-by side in the direction X or the direction Y and coupled with each other. The electronic device 10 may have a design of three-side zero-border or four-side zero-border, but not limited herein.

As shown in FIG. 1, the electronic device 10 may include a substrate 100 (which may be referred to as a first substrate), a substrate 102 (which may be referred to as a second substrate), a display element layer 104 and a plurality of traces 106. The substrate 100 may include a surface 1002 (which may be referred to as a first surface) and a surface 1004 (which may be referred to as a second surface) opposite to the surface 1002, and the substrate 102 may be disposed opposite to the substrate 100. The surface 1002 is distant from the substrate 102, and the surface 1004 is close to the substrate 102. In addition, the substrate 100 may include a side surface 1006. The side surface 1006 may be between the surface 1002 and the surface 1004, and the side surface 1006 may be connected with the surface 1002 and the surface 1004. The circuit structure, electrode, signal line, protective layer, color resist material, quantum dot material, optical film or other suitable elements or materials may be disposed on the surface 1004 of the substrate 100 (in the direction Z), and not limited herein. The electrode, signal line, protective layer, color resist material, quantum dot material, optical film or other suitable elements or materials may be disposed on the substrate 102, and not limited herein.

The substrate 100 or the substrate 102 may be transparent or opaque organic material or inorganic material. The material of the substrate 100 or the substrate 102 may include glass, quartz, sapphire, polymer (such as polyimide (PI), polyethylene terephthalate (PET)) and/or other suitable materials and may be served as a flexible substrate or a hard substrate, but not limited herein.

The display element layer 104 may be disposed between the substrate 102 and the substrate 100. The display element layer 104 may include light emitting diodes, liquid crystal, fluorescence, phosphors, other suitable display media or combinations of the above, but not limited herein. For example, the display element layer 104 of this embodiment may include micro-LEDs, and quantum dot materials may be disposed on the substrate 100 or the substrate 102, but not limited herein.

As shown in FIG. 1, the traces 106 of this embodiment may be disposed on the surface 1002, the surface 1004 and the side surface 1006 of the substrate 100, and the traces 106 may be electrically connected with the signal lines, the electrodes or other electronic elements disposed on the surface 1004 of the substrate 100, and the traces 106 may extend from the surface 1004 to the surface 1002 through the side surface 1006. In detail, the traces 106 may extend from the surface 1004 to the surface 1002 through the side surface 1006 by printing, spray printing or other suitable manufacturing methods, but the disposing method of the trace 106 is not limited herein.

The trace 106 may be, for example, aurum (Au), copper (Cu), aluminum (Al) or other suitable conductive materials. In addition, the electronic device 10 may include a plurality of adhesive layers 108, and one adhesive layer 108 may be correspondingly disposed at one end of a trace 106 on the surface 1002. The adhesive layer 108 may be an anisotropic conductive film (ACF), but not limited herein.

The electronic device may include a plurality of flexible circuit elements 110 and a plurality of driving circuit boards 112. The flexible circuit element 110 may be disposed on the surface 1002 of the substrate 100 (in the reverse direction of the direction Z), and one end of the flexible circuit element 110 may be disposed on the adhesive layer 108 (in the reverse direction of the direction Z). One end of a flexible circuit element 110 may be electrically connected to a trace 106 by the adhesive layer 108, and another end of the flexible circuit element 110 may be electrically connected to a driving circuit board 112. In detail, the driving circuit board 112 may transmit signals to the signal lines, electrodes or other electronic elements in the electronic device 10 through the flexible circuit element 110 and the trace 106.

In some embodiments, the flexible circuit element 110 may be a chip on film (COF) or a flexible printed circuit (FPC), but not limited herein. In some embodiments, the driving circuit board 112 may be a printed circuit board (PCB), but not limited herein.

In some embodiments (as shown in FIG. 1), the electronic device 10 may include a thermal dissipation sheet 1141 (also referred to as a first sub-thermal dissipation sheet 1141) and two thermal dissipation sheets 1143 (also referred to as a second sub-thermal dissipation sheet 1143 and a third sub-thermal dissipation sheet 1143), and the thermal dissipation sheet 1141 and the thermal dissipation sheets 1143 may together be regarded as a first thermal dissipation sheet. The thermal dissipation sheet 1141 may be disposed on the surface 1002 of the substrate 100 (in the reverse direction of the direction Z), and the disposing method of the thermal dissipation sheet may be altered according to the product requirements, for example, the thermal dissipation sheet 1141 may be disposed between the two thermal dissipation sheets 1143, and not limited herein. The thermal dissipation sheet 1143 may be disposed on a portion of the trace 106 located on the surface 1002 (in the reverse direction of the direction Z) and not covered by the adhesive layer 108. The thermal dissipation sheet 1141 and the thermal dissipation sheet 1143 may be non-adhesive thermal conductive materials or thermal dissipative materials or adhesive thermal conductive materials or thermal dissipative materials according to the product requirements. In this embodiment, the thermal dissipation sheet 1141 and the thermal dissipation sheet 1143 may be adhesive thermal conductive materials or thermal dissipative materials. The thermal dissipation sheet 1141 and the thermal dissipation sheet 1143 may include a thermal tape or a thermal paste with a plurality of thermal dissipative particles, but not limited herein. The thermal dissipative particles may include metal particles or graphite particles, but not limited herein. Therefore, the thermal dissipation sheet 1141 and the thermal dissipation sheets 1143 may have the function of thermal conduction or thermal dissipation.

Figure 2B:
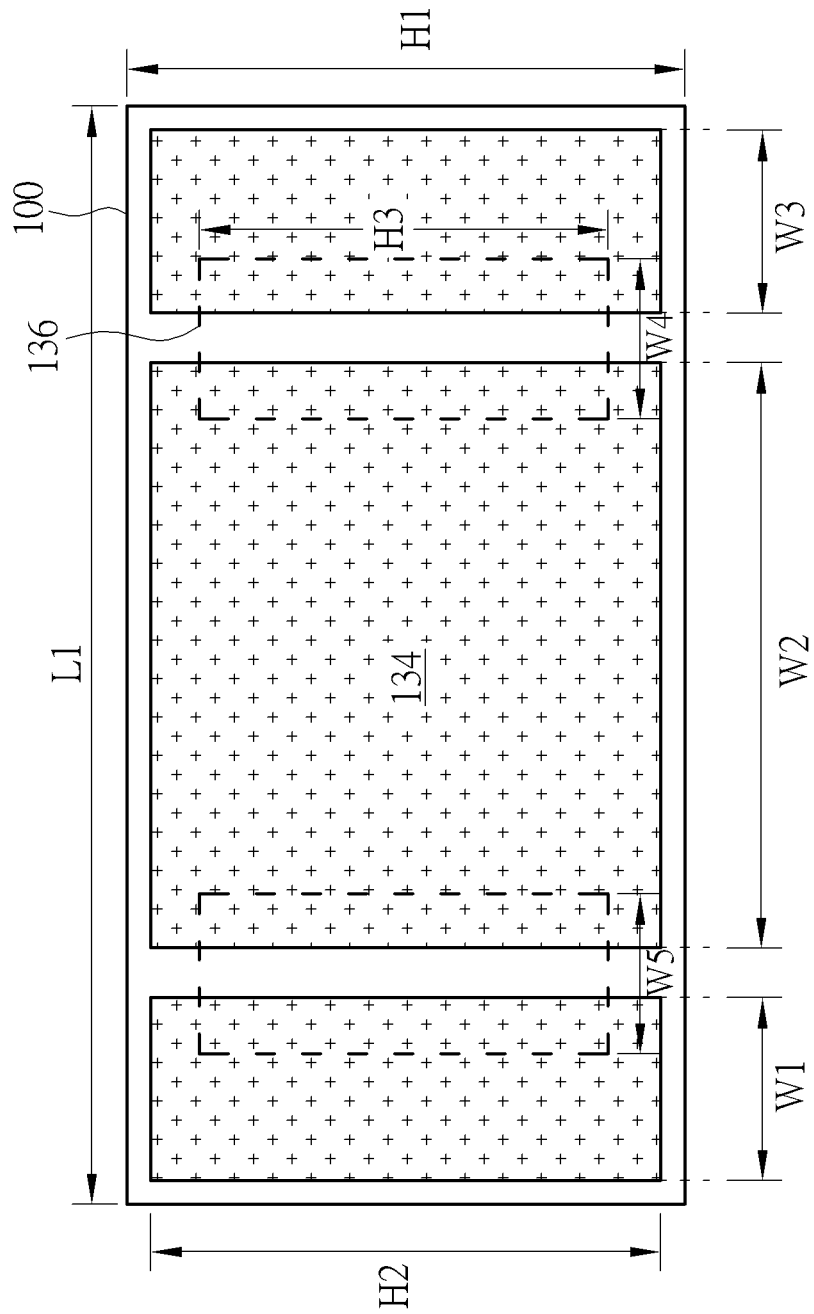
FIG. 2B is a schematic diagram of a projection image of the first embodiment according to the present disclosure.

In some embodiments (as shown in FIG. 2B, which is a schematic diagram of a projection image of the first embodiment according to the present disclosure), the thermal dissipation sheet 1141 and the thermal dissipation sheets 1143 may have a first projection image (as labeled by the symbol 134 in FIG. 2B) on the surface 1002. The first projection image is an image of the thermal dissipation sheet 1141 and the thermal dissipation sheets 1143 projected on the surface 1002 along the direction Z, that is, the first projection image is an orthographic projection, and a ratio of an area of the first projection image to an area of the surface 1002 of the substrate 100 is greater than or equal to 0.7 and less than or equal to 1.

For example, the thermal dissipation sheet 1141 and the thermal dissipation sheets 1143 may be projected on the surface 1002 along the direction Z to obtain a first projection image. The area of the first projection image may be the sum of the length W1×the width H2, the length W2×the width H2 and the length W3×the width H2, and the area of the surface 1002 of the substrate 100 may be the length L1×the width H1. The length L1, length W1, length W2 and length W3 are the maximum distances along the direction X, and the width H1 and the width H2 are the maximum distances along the direction Y. The ratio may be obtained by dividing the area of the first projection image by the area of the surface 1002 of the substrate 100, and the ratio may be greater than or equal to 0.7 and less than or equal to 1.

For simplicity, some of the elements are omitted in FIG. 2B. The first projection image may present as, for example, square, trapezoid, circular or any shapes according to the product requirements, and the calculation method of area should be properly selected according to the shape of the projection image, such as the integration of an area, but not limited herein.

In some embodiments (as shown in FIG. 1), the electronic device 10 may include a thermal dissipation sheet 1161 (also referred to as a fourth sub-thermal dissipation sheet 1161) and a thermal dissipation sheet 1163 (also referred to as a fifth sub-thermal dissipation sheet 1163) disposed on the thermal dissipation sheet 1141 (in the reverse direction of the direction Z), and the thermal dissipation sheet 1161 and the thermal dissipation sheet 1163 may together be regarded as a second thermal dissipation sheet. For example, the thermal dissipation sheet 1161 and the thermal dissipation sheet 1163 may be disposed on two sides of the thermal dissipation sheet 1141 in the direction X and partially overlap the thermal dissipation sheet 1141 in the direction X. As shown in FIG. 1, the thermal dissipation sheet 1141 may be disposed between the thermal dissipation sheet 1161 and the surface 1002 of the substrate 100, and may be disposed between the thermal dissipation sheet 1163 and the surface 1002 of the substrate 100.

In some embodiments (as shown in FIG. 2B), the thermal dissipation sheet 1161 and thermal dissipation sheet 1163 may have a second projection image (as labeled by the symbol 136 in FIG. 2B) on the surface 1002. The second projection image is an image of the thermal dissipation sheet 1161 and the thermal dissipation sheets 1163 projected on the surface 1002 along the direction Z, and a ratio of an area of the second projection image to the area of the first projection image is greater than or equal to 0.1 and less than or equal to 0.6, greater than or equal to 0.2 and less than or equal to 0.5, or greater than or equal to 0.3 and less than or equal to 0.4.

In detail, the heat generated by the electronic device 10 cannot be effectively removed when the ratio of the area of the second projection image to the area of the first projection image is less than 0.1. When the ratio of the area of the second projection image to the area of the first projection image is greater than 0.6, the efficiency of removing the heat generated by the electronic device 10 is approximately equal to the efficiency obtained when the ratio of the area of the second projection image to the area of the first projection image is equal to 0.6, which may cause an increase in cost without having improved efficiency. The area of the first projection image, the area of the second projection image and the ratio of the area of the second projection image to the area of the first projection image are calculated in the same method as the above description, and will not be described redundantly herein. The length W4 and the length W5 are the maximum distances along the direction X, and the width H3 is the maximum distance along the direction Y.

The thermal dissipation sheet 1161 and the thermal dissipation sheet 1163 may have the functions of thermal conduction and thermal dissipation, and the material of the thermal dissipation sheet 1161 and the thermal dissipation sheet 1163 are different from the material of the thermal dissipation sheet 1141 and the thermal dissipation sheets 1143. The thermal dissipation sheet 1161 and the thermal dissipation sheet 1163 may include foils or films with high thermal conductivity materials, and the material of the thermal dissipation sheet 1161 and the thermal dissipation sheets 1163 may include metal (such as aluminum and copper) or graphite, but not limited herein. Furthermore, the thermal conductivity coefficient of the thermal dissipation sheet 1161 and the thermal dissipation sheets 1163 is different from the thermal conductivity coefficient of the thermal dissipation sheet 1141 and the thermal dissipation sheets 1143, and the thermal conductivity coefficient of the thermal dissipation sheet 1161 and the thermal dissipation sheet 1163 may be greater than the thermal conductivity coefficient of the thermal dissipation sheet 1141 and the thermal dissipation sheets 1143. The thermal conductivity coefficient of the thermal dissipation sheet 1161 and the thermal dissipation sheet 1163 may be, for example, in a range of 200-1200 (W/mK), and the thermal conductivity coefficient of the thermal dissipation sheet 1141 and the thermal dissipation sheets 1143 may be, for example, in a range of 0.1-4 (W/mK). The effects of thermal conduction and thermal dissipation of the thermal dissipation sheet 1161 and the thermal dissipation sheet 1163 may be better than those of the thermal dissipation sheet 1141 and the thermal dissipation sheets 1143.

As shown in FIG. 1 and FIG. 2A, the electronic device 10 may include a thermal dissipation element 118 disposed on the substrate 100 (in the reverse direction of the direction Z), and the first thermal dissipation sheet (i.e., the thermal dissipation sheet 1141 and the thermal dissipation sheets 1143) may be disposed between the thermal dissipation element 118 and the substrate 100. In some embodiments, the thermal dissipation element 118 at least partially overlaps the traces 106 in the direction Z. In some embodiments, the thermal dissipation element 118 may, for example, include at least one metal bulk, at least one graphite bulk or a combination of the above, but not limited herein. In detail, as shown in FIG. 1, the thermal dissipation element 118 may include a metal bulk 1201(also referred to as a third metal bulk 1201) and two metal bulks 1203 (also referred to as a first metal bulk 1203 and a second metal bulk 1203). The material of the metal bulks may include aluminum or copper, but not limited herein.

The thermal dissipation sheet 1141 may be disposed between the metal bulk 1201 and the substrate 100. The metal bulk 1201 of the thermal dissipation element 118 may at least partially overlap the thermal dissipation sheet 1141, wherein "at least partially overlap" means that elements may completely overlap with each other or one portion of an element may overlap one portion of another element. In addition, the thermal dissipation sheet 1143 may be disposed between the metal bulk 1203 and the substrate 100. For example, one of the thermal dissipation sheets 1143 is disposed between one of the metal bulks 1203 and the substrate 100, and the other one of the thermal dissipation sheets 1143 is disposed between the other one of the metal bulks 1203 and the substrate 100, but not limited herein. Since the thermal dissipation sheet 1141 and the thermal dissipation sheets 1143 are adhesive, the metal bulk 1201 and the metal bulks 1203 may be adhered to the substrate 100 by the thermal dissipation sheet 1141 and the thermal dissipation sheets 1143.

In addition, the second thermal dissipation sheet may be disposed between the thermal dissipation element 118 and the first thermal dissipation sheet. In some embodiments (as shown in FIG. 1), a portion of the thermal dissipation sheet 1161 may be disposed between the metal bulk 1201 and the thermal dissipation sheet 1141, and another portion of the thermal dissipation sheet 1161 may be disposed between one of the metal bulks 1203 and the thermal dissipation sheet 1141. Similarly, a portion of the thermal dissipation sheet 1163 may be disposed between the metal bulk 1201 and the thermal dissipation sheet 1141, and another portion of the thermal dissipation sheet 1163 may be disposed between the other one of the metal bulks 1203 and the thermal dissipation sheet 1141.

In addition, the driving circuit board 112 may be disposed on the thermal dissipation element 118 (in the reverse direction of the direction Z). In some embodiments (as shown in FIG. 1 and FIG. 2A), the driving circuit board 112 may be disposed on a surface 120a of the metal bulk 1201, and the surface 120a is a surface of the metal bulk 1201 that is away from the substrate 100. Since other elements (such as the flexible circuit elements 110) may also be disposed on the surface 1002 of the substrate 100 (in the reverse direction of the direction Z) according to the product requirements, the thermal dissipation element 118 (such as the metal bulks) may not be entirely disposed on the surface 1002 (in the reverse direction of the direction Z).

In some embodiments, by disposing the thermal dissipation sheet 1141, the thermal dissipation sheets 1143, the thermal dissipation sheet 1161 and the thermal dissipation sheet 1163, heat may be conducted laterally from the first thermal dissipation sheet (such as the thermal dissipation sheet 1141 and the thermal dissipation sheets 1143) to the adjacent thermal dissipation element 118 through the thermal dissipation sheet 1161 and the thermal dissipation sheet 1163 since the thermal dissipation sheet 1161 and the thermal dissipation sheet 1163 partially overlap the first thermal dissipation sheet.

Further, the thermal dissipation sheet 1141 and the thermal dissipation sheets 1143 may effectively remove the heat generated by the electronic device 10 uniformly since most of the surface 1002 of the substrate 100 is covered by the thermal dissipation sheet 1141 and the thermal dissipation sheets 1143 (i.e., high area ratio). The thermal dissipation sheet 1141 and the thermal dissipation sheets 1143 may conduct the heat to the thermal dissipation element 118, the thermal dissipation sheet 1161 and the thermal dissipation sheet 1163 in a vertical direction (e.g., parallel to the direction Z). The thermal dissipation sheet 1161 and the thermal dissipation sheet 1163 may conduct the heat to the thermal dissipation element 118 in a lateral direction (e.g., vertical to the direction Z).

In detail, when the ratio of the area of the first projection image of the thermal dissipation sheet 1141 and the thermal dissipation sheets 1143 to the area of the surface 1002 of the substrate 100 of the electronic device 10 is greater than or equal to 0.7 and less than or equal to 1 (for example, the ratio is greater than or equal to 0.75 and less than or equal to 0.95, or greater than or equal to 0.8 and less than or equal to 0.9), and the ratio of the area of the second projection image of the thermal dissipation sheet 1161 and the thermal dissipation sheet 1163 to the area of the surface 1002 of the substrate 100 of the electronic device 10 is greater than or equal to 0.2 and less than or equal to 0.7, or greater than or equal to 0.3 and less than or equal to 0.6, the transfer of thermal energy of the electronic device 10 may be improved, and the heat generated by the electronic device 10 may be effectively removed by the thermal dissipation element 118. Therefore, the decrease of the lifetime of the light emitting elements may be mitigated, and the brightness reduction or non-uniform brightness of the electronic device 10 may further be mitigated. The area of the second projection image, the area of the surface 1002 of the substrate 100 and the ratio of the area of the second projection image to the area of the surface 1002 of the substrate 100 can be calculated in the same method as the above description, and will not be described redundantly herein.

It is noted that, air gaps may be generated when the contact surface is not smooth enough, and the air gaps may cause the problem that the thermal energy may not be transmitted effectively and immediately by the thermal dissipation element 118, the thermal dissipation sheet 1161 or the thermal dissipation sheet 1163. Since the thermal conductivity coefficient of the thermal dissipation sheet 1141 and the thermal dissipation sheets 1143 is greater than the thermal conductivity coefficient of air (0.024 W/mK), the above problem can be reduced by fixing the thermal dissipation element 118, the thermal dissipation sheet 1161 or the thermal dissipation sheet 1163 to the substrate 100 through the thermal dissipation sheet 1141 and the thermal dissipation sheets 1143 that are adhesive.

In addition, the surface of the thermal dissipation sheet 1143 (adjacent to the surface of the metal bulk 1203) and the surface of the flexible circuit element 110 (adjacent to the surface of the metal bulk 1203) may be discontinuous, and a gap may exist between the surface of the thermal dissipation sheet 1143 and the surface of the flexible circuit element 110. In order to increase the adhesion of the metal bulk 1203, at least one thermal dissipation pad 122 may be disposed. As shown in FIG. 1, a portion of the thermal dissipation pad 122 may be disposed between the metal bulk 1203 and the thermal dissipation sheet 1143, and another portion of the thermal dissipation pad 122 may be disposed between the metal bulk 1203 and the flexible circuit element 110. The thermal dissipation pad 122 may include the material with elasticity and function of thermal conduction or thermal dissipation, but not limited herein.

Other embodiments of the present disclosure will be disclosed in the following. In order to simplify the illustration, the same elements in the following would be labeled with the same symbol. For clearly showing the differences between various embodiments, the differences between different embodiments are described in detail below, and repeated features will not be described redundantly. The electronic devices of the following embodiments may also provide the functions of the electronic device of the first embodiment.

Figure 3:
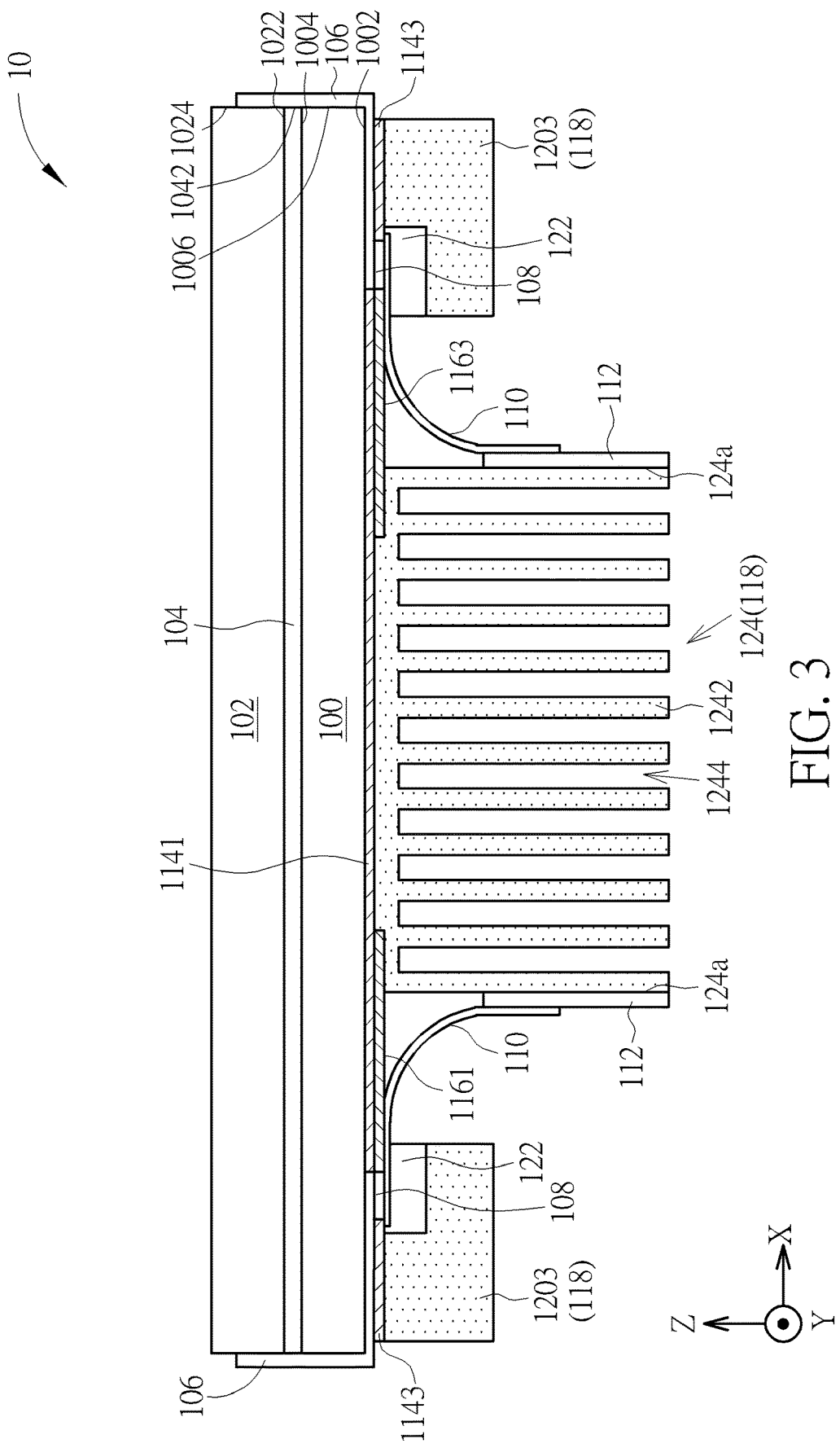
FIG. 3 is a sectional-view schematic diagram of an electronic device of a second embodiment according to the present disclosure.

Please refer to FIG. 3, which is a sectional-view schematic diagram of an electronic device of a second embodiment according to the present disclosure. The difference between this embodiment and the first embodiment (as shown in FIG. 1) is that the thermal dissipation element 118 of this embodiment may include a fin heat sink 124 to replace the metal bulk 1201 in the first embodiment. The thermal dissipation sheet 1141 may be disposed between the fin heat sink 124 and the substrate 100, and the fin heat sink 124 at least partially overlap the thermal dissipation sheet 1141 along the direction Z. In some embodiments, the thermal dissipation element 118 may include a honeycomb-shaped heat sink.

The fin heat sink 124 may include metal materials, such as aluminum, copper, etc., but not limited herein. The fin heat sink 124 may include a plurality of thermal dissipation plates 1242 extending along the direction Z, the thermal dissipation plates 1242 are spaced apart from each other, and air gaps 1244 may exist between the thermal dissipation plates 1242, but not limited herein. In addition, the weight of the fin heat sink 124 may be less than the weight of the metal block 1201 in the first embodiment, and the weight of the electronic device 10 may be reduced.

In some embodiments, the driving circuit board 112 may be disposed on the thermal dissipation element 118. For example, the driving circuit board 112 and the thermal dissipation element 118 may be disposed along the direction X. As shown in FIG. 3, one end of the flexible circuit element 110 and the driving circuit board 112 may be disposed on a side surface 124a of the fin heat sink 124 along the direction X. For example, one end of the flexible circuit element 110 and the driving circuit board 112 may be disposed on the side surface 124a of the outermost thermal dissipation plate 1242 along the direction X.

In some embodiments (as shown in FIG. 3 to FIG. 6), the trace 106 may extend from a side surface 1024 of the substrate 102 to the surface 1002 of the substrate 100 through a side surface 1042 of the display element layer 104 and a side surface 1006 of the substrate 100, and the trace 106 may be, for example, electrically connected to the driving circuit board 112 by the adhesive layer 108 and the flexible circuit element 110. The trace 106 may be disposed in different methods according to the product requirements, and not limited to the above.

Figure 4:
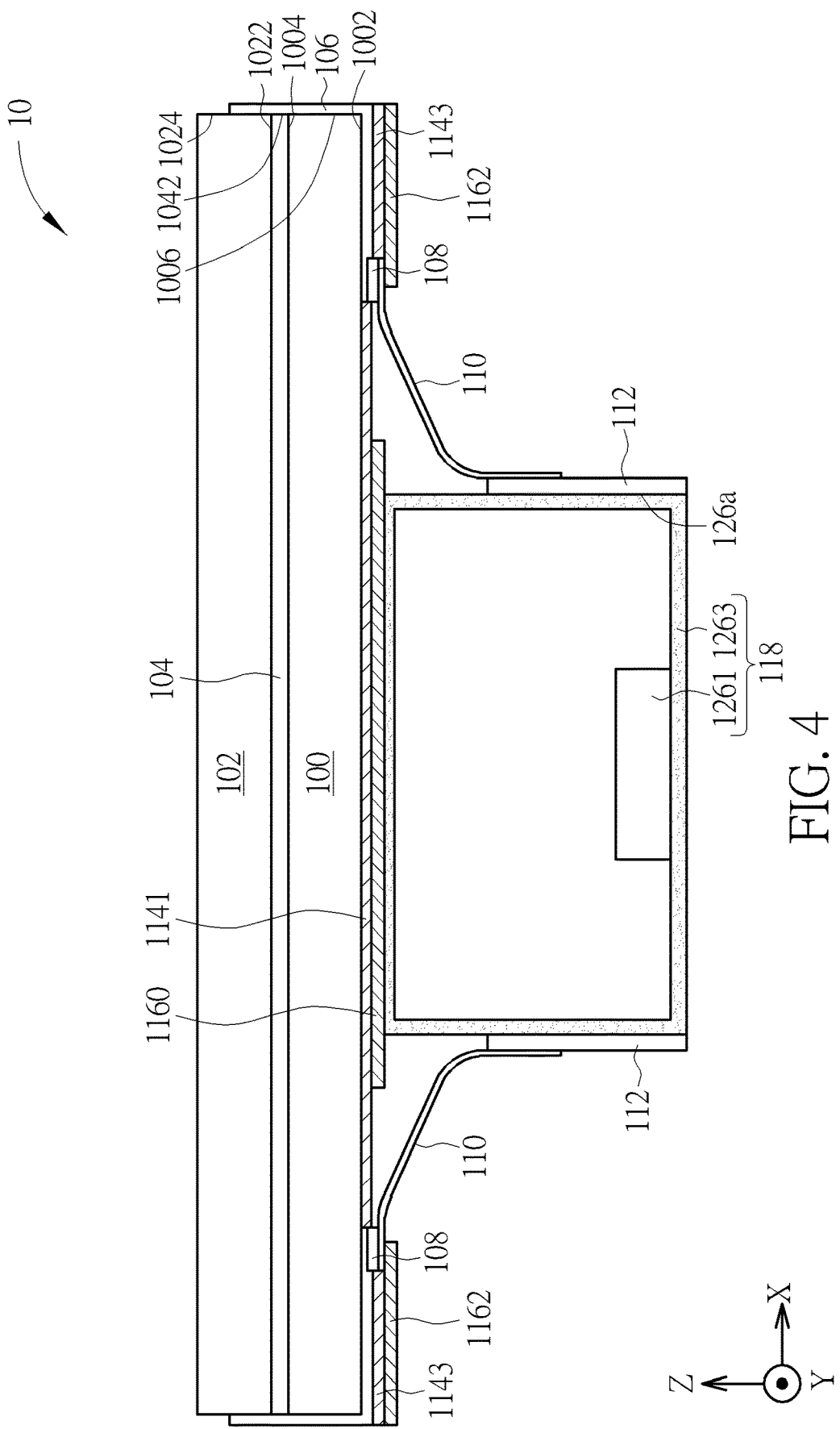
FIG. 4 is a sectional-view schematic diagram of an electronic device of a third embodiment according to the present disclosure.

Please refer to FIG. 4, which is a sectional-view schematic diagram of an electronic device of a third embodiment according to the present disclosure. The difference between this embodiment and the first embodiment (as shown in FIG. 1) is that the thermal dissipation element 118 of this embodiment may include a bracket 1263 having a fan 1261, and the heat generated by the electronic device 10 may be removed by the fan 1261. The material of the bracket 1263 may include metal or plastic, but not limited herein. In addition, the bracket 1263 and the fan 1261 at least partially overlap the thermal dissipation sheet 1141 along the direction Z. In some embodiments, the thermal dissipation sheet 1141 may be disposed between the bracket 1263 and the substrate 100. In some embodiments, the driving circuit board 112 may be disposed on the thermal dissipation element 118 along the direction X. As shown in FIG. 4, the driving circuit board 112 may be disposed on a side surface 126a of the bracket 1263 along the direction X.

In some embodiments (as shown in FIG. 4), the electronic device 10 may include a thermal dissipation sheet 1160 (also referred to as a fourth sub-thermal dissipation sheet 1160 in this embodiment) and two thermal dissipation sheets 1162, and the thermal dissipation sheet 1160 and the thermal dissipation sheets 1162 may together be regarded as the second thermal dissipation sheet. The thermal dissipation sheet 1160 may be disposed between the thermal dissipation sheet 1141 and the bracket 1263, and the thermal dissipation sheet 1162 may be disposed on the thermal dissipation sheet 1143 and may overlap a portion of the flexible circuit element 110 in the direction Z. The material of the thermal dissipation sheet 1160 and the thermal dissipation sheets 1162 may be identical to the material of the thermal dissipation sheet 1161 and the thermal dissipation sheets 1163 in the first embodiment.

Figure 5:
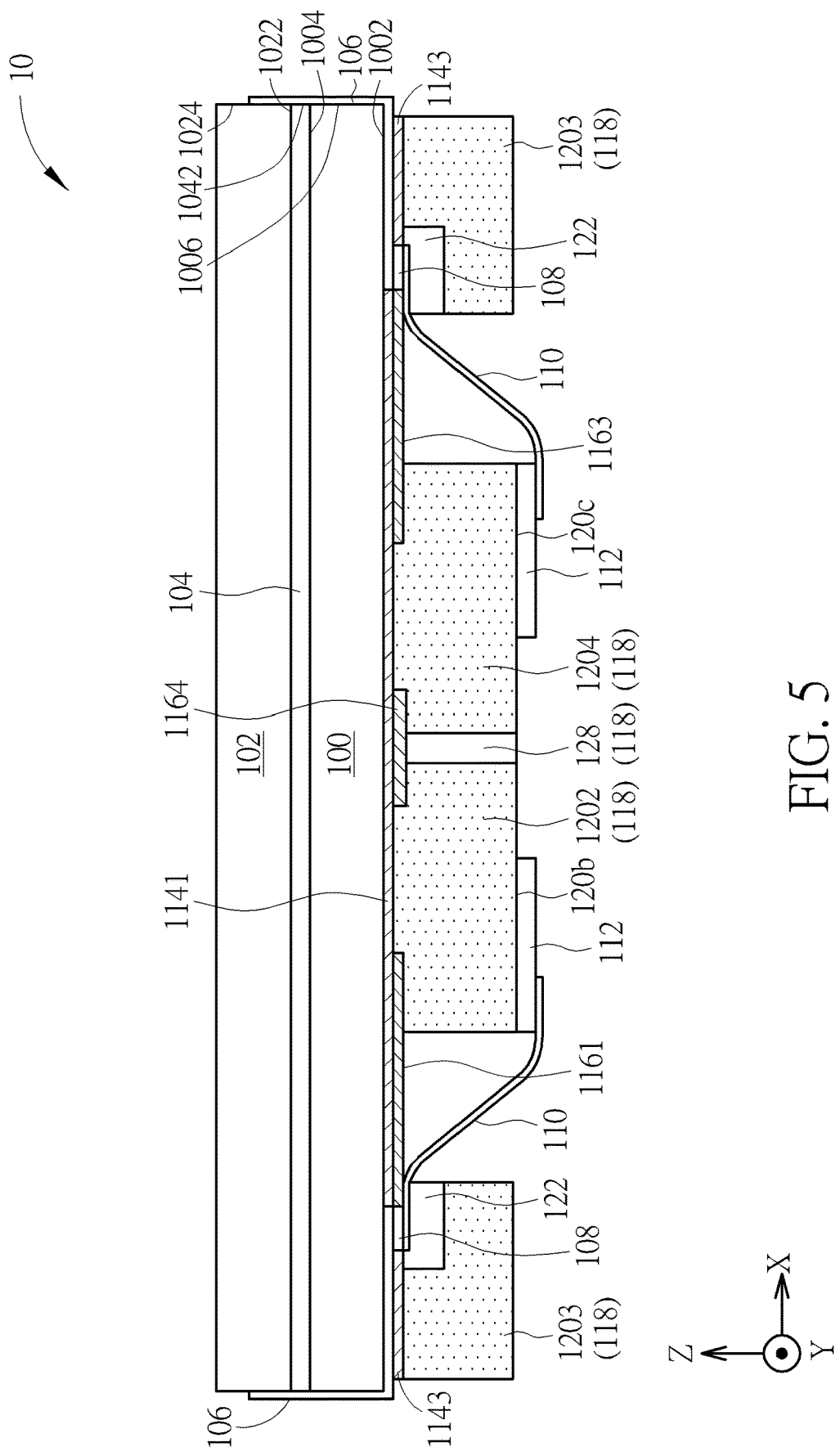
FIG. 5 is a sectional-view schematic diagram of an electronic device of a fourth embodiment according to the present disclosure.

Please refer to FIG. 5, which is a sectional-view schematic diagram of an electronic device of a fourth embodiment according to the present disclosure. The difference between this embodiment and the first embodiment (as shown in FIG. 1) is that the thermal dissipation element 118 of this embodiment may include a metal bulk 1202 (also referred to as a fourth metal bulk 1202), a metal bulk 1204 (also referred to as a fifth metal bulk 1204) and a thermal dissipation medium 128 to replace the metal bulk 1201 in the first embodiment. The thermal dissipation medium 128 may be disposed between the metal bulk 1202 and the metal bulk 1204 in direction X. In some embodiments, the thermal dissipation sheet 1141 may be disposed between the metal bulk 1202 and the substrate 100, between the thermal dissipation medium 128 and the substrate 100, and between the metal bulk 1204 and the substrate 100, but not limited herein. The thermal dissipation medium 128 may include the material with elasticity and the function of thermal conduction or thermal dissipation, and the thermal dissipation medium 128 may be a thermal paste or a thermal pad, but not limited herein.

Since the thermal expansion coefficient of the metal bulk is different from the thermal expansion coefficient of the substrate 100, thus, when the volume of the metal bulk of the thermal dissipation element 118 is too large, the difference between the volume of the metal bulk and the volume of the substrate 100 after being heated and expanded will cause the substrate 100 to warp, and the elements in the electronic device 10 may be damaged. In this embodiment, the thermal dissipation medium 128 with elasticity is disposed between the metal bulk 1202 and the metal bulk 1204, and the thermal dissipation medium 128 can provide a buffer space for the metal bulks after being heated and expanded, thereby mitigating the warping of the substrate 100.

In addition, the second thermal dissipation sheet may further include a thermal dissipation sheet 1164 (also referred to as a sixth sub-thermal dissipation sheet 1164) disposed between the thermal dissipation medium 128 and the surface 1002 of the substrate 100. As shown in FIG. 5, the metal bulk 1202 may overlap a portion of the surface of the thermal dissipation sheet 1161, a portion of the surface of the thermal dissipation sheet 1141 and a portion of the surface of the thermal dissipation sheet 1164 in the direction Z, and the metal bulk 1204 may overlap a portion of the surface of the thermal dissipation sheet 1163, another portion of the surface of the thermal dissipation sheet 1141 and another portion of the surface of the thermal dissipation sheet 1164 in the direction Z.

The thermal dissipation sheet 1164 may include the same material as the thermal dissipation sheet 1161 and the thermal dissipation sheet 1163, and the thermal dissipation sheet 1164 may conduct the heat to the adjacent metal bulk 1202 and the adjacent metal bulk 1204 in a lateral direction. The thermal conductivity coefficient of the thermal dissipation medium 128 may be different from the thermal conductivity coefficient of the thermal dissipation sheet 1161, the thermal dissipation sheet 1163 and the thermal dissipation sheet 1164. In detail, the thermal conductivity coefficient of the thermal dissipation medium 128 is less than the thermal conductivity coefficient of the thermal dissipation sheet 1161, the thermal dissipation sheet 1163 and the thermal dissipation sheet 1164.

In addition, as shown in FIG. 5, one of the driving circuit boards 112 may be disposed on a surface 120b of the metal bulk 1202 (in the reverse direction of the direction Z), and the surface 120b is a surface of the metal bulk 1202 away from the substrate 100. One of the driving circuit boards 112 may be disposed on a surface 120c of the metal bulk 1204 (in the reverse direction of the direction Z), and the surface 120c is a surface of the metal bulk 1204 away from the substrate 100.

Figure 6:
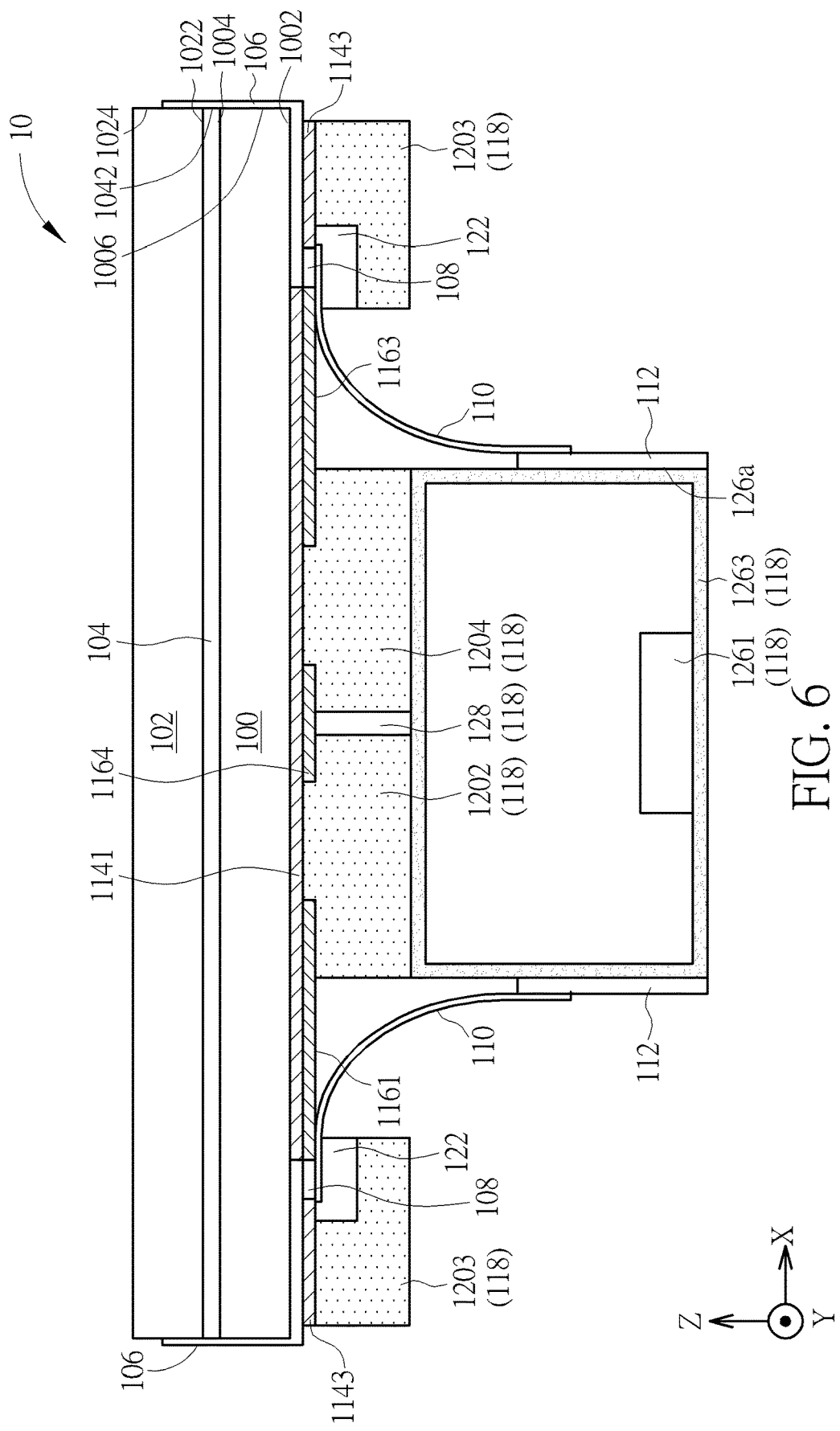
FIG. 6 is a sectional-view schematic diagram of an electronic device of a fifth embodiment according to the present disclosure.

Please refer to FIG. 6, which is a sectional-view schematic diagram of an electronic device of a fifth embodiment according to the present disclosure. The difference between this embodiment and the fourth embodiment (as shown in FIG. 5) is that the thermal dissipation element 118 of this embodiment may further include a bracket 1263 and a fan 1261 disposed on the bracket 1263, and the bracket 1263 and the fan 1261 may be disposed on the metal bulk 1202, the metal bulk 1204 and the thermal dissipation medium 128, so that the metal bulk 1202, the metal bulk 1204 and the thermal dissipation medium 128 are disposed between the substrate 100 and the fan 1261. The heat generated by the electronic device 10 may be more effectively removed by the metal bulk 1202, the metal bulk 1204 and the fan 1261. Further, as shown in FIG. 6, the driving circuit board 112 may be disposed on the side surface 126a of the bracket 1263 along the direction X.

In addition, in some embodiments, the bracket 1263 and the fan 1261 may also be disposed on the fin heat sink 124 of FIG. 3, so that the fin heat sink 124 is disposed between the substrate 100 and the fan 1261, and the heat generated by the electronic device 10 may be removed more effectively.

Figure 7:
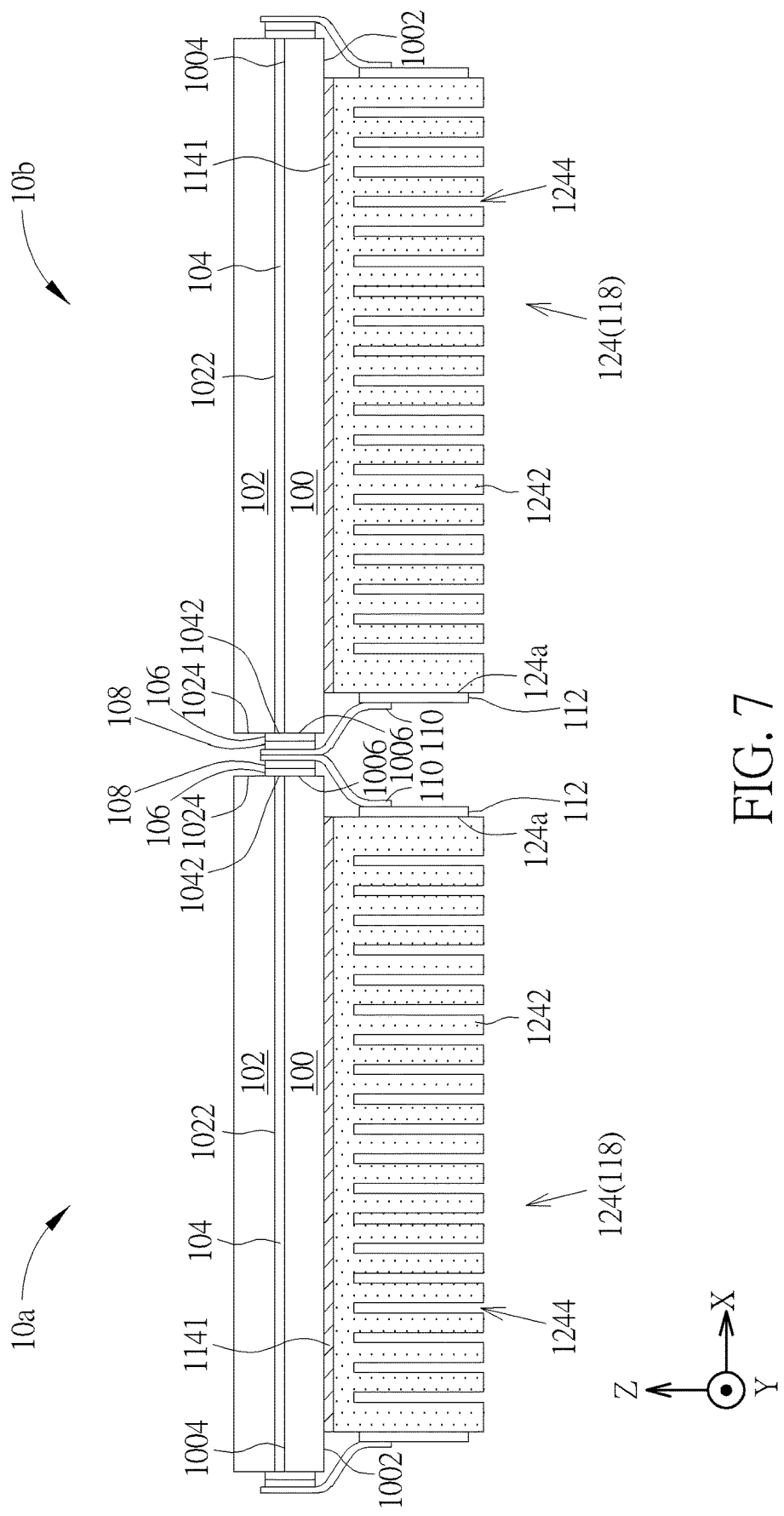
FIG. 7 is a sectional-view schematic diagram of an electronic device of a sixth embodiment according to the present disclosure.

Please refer to FIG. 7, which is a sectional-view schematic diagram of an electronic device of a sixth embodiment according to the present disclosure. FIG. 7 shows an example of a tiled electronic device, wherein an electronic device 10a is coupled to another electronic device 10b in the direction X. For example, the side surface 1024 on the right side of the substrate 102 of the electronic device 10a may be disposed adjacent to the side surface 1024 on the left side of the substrate 102 of the electronic device 10b, and/or the side surface 1006 on the right side of the substrate 100 of the electronic device 10a may be disposed adjacent to the side surface 1006 on the left side of the substrate 100 of the electronic device 10b.

In some embodiments, when the electronic devices 10 are arranged side-by-side and coupled to each other along the direction X, the trace 106, the adhesive layer 108 and one end of the flexible circuit element 110 in each of the electronic device 10a and the electronic device 10b may be disposed on the side surface of the substrate, but not limited herein. As shown in each of the electronic device 10a and the electronic device 10b of FIG. 7, the trace 106, the adhesive layer 108 and one end of the flexible circuit element 110 may be disposed on a portion of the side surface 1024 of the substrate 102, the side surface 1042 of the display element layer 104 and a portion of the side surface 1006 of the substrate 100, wherein the adhesive layer 108 is disposed between the trace 106 and the flexible circuit element 110. In addition, a protective layer (not shown) may be disposed between the flexible circuit element 110 on the right side surface of the electronic device 10a and the flexible circuit element 110 on the left side surface of the electronic device 10b.

In addition, in each of the electronic device 10a and the electronic device 10b, another end of the flexible circuit element 110 and the driving circuit board 112 may be disposed on the side surface 124a of the fin heat sink 124 along the direction X. For example, another end of the flexible circuit element 110 and the driving circuit board 112 may be disposed on the side surface 124a of the outermost thermal dissipation plate 1242 along the direction X.

Since the traces 106 and the adhesive layers 108 do not occupy the area of the surface 1002 of the substrate 100, and more specifically, the traces 106 and the adhesive layers 108 do not overlap the surface 1002 of the substrate 100 in the direction Z, the area or volume of the fin heat sink 124 on the surface 1002 (in the reverse direction of the direction Z) may be increased, and the heat generated by the electronic device 10a and the electronic device 10b may be removed more effectively. The thermal dissipation element 118 in FIG. 7 is not limited to the fin heat sink, and may include the thermal dissipation elements in other embodiments.

In some embodiments, each of the electronic device 10a and the electronic device 10b as shown in FIG. 7 may include the thermal dissipation sheet 1141 (i.e., a first thermal dissipation sheet) disposed between the thermal dissipation element 118 and the substrate 100, and may not include the second thermal dissipation sheet (e.g., the thermal dissipation sheet 1161 and the thermal dissipation sheet 1163 of FIG. 1). In addition, the fin heat sink 124 of the thermal dissipation element 118 may at least partially overlap the first thermal dissipation sheet.

Figure 8:
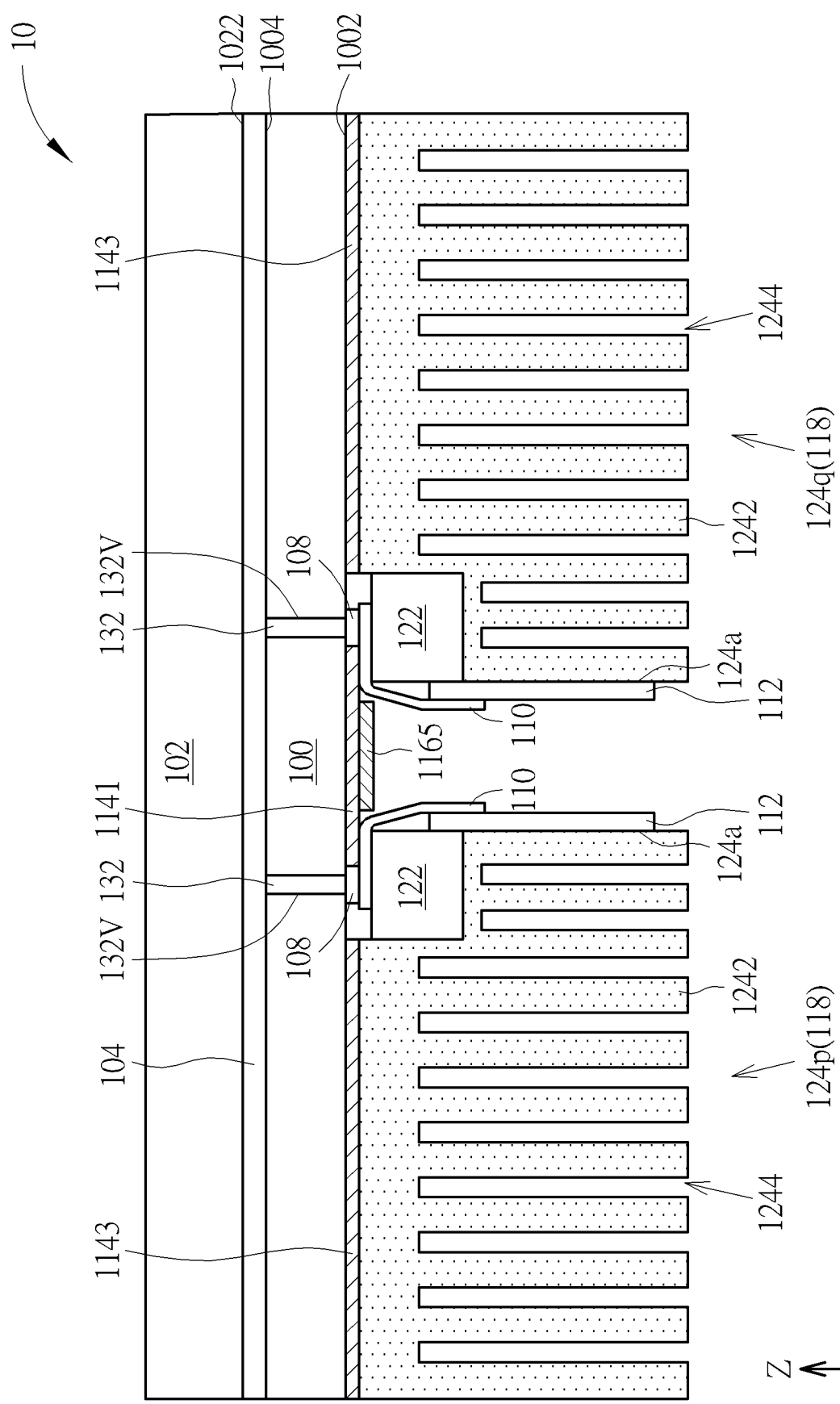
FIG. 8 is a sectional-view schematic diagram of an electronic device of a seventh embodiment according to the present disclosure.
Figure 9:
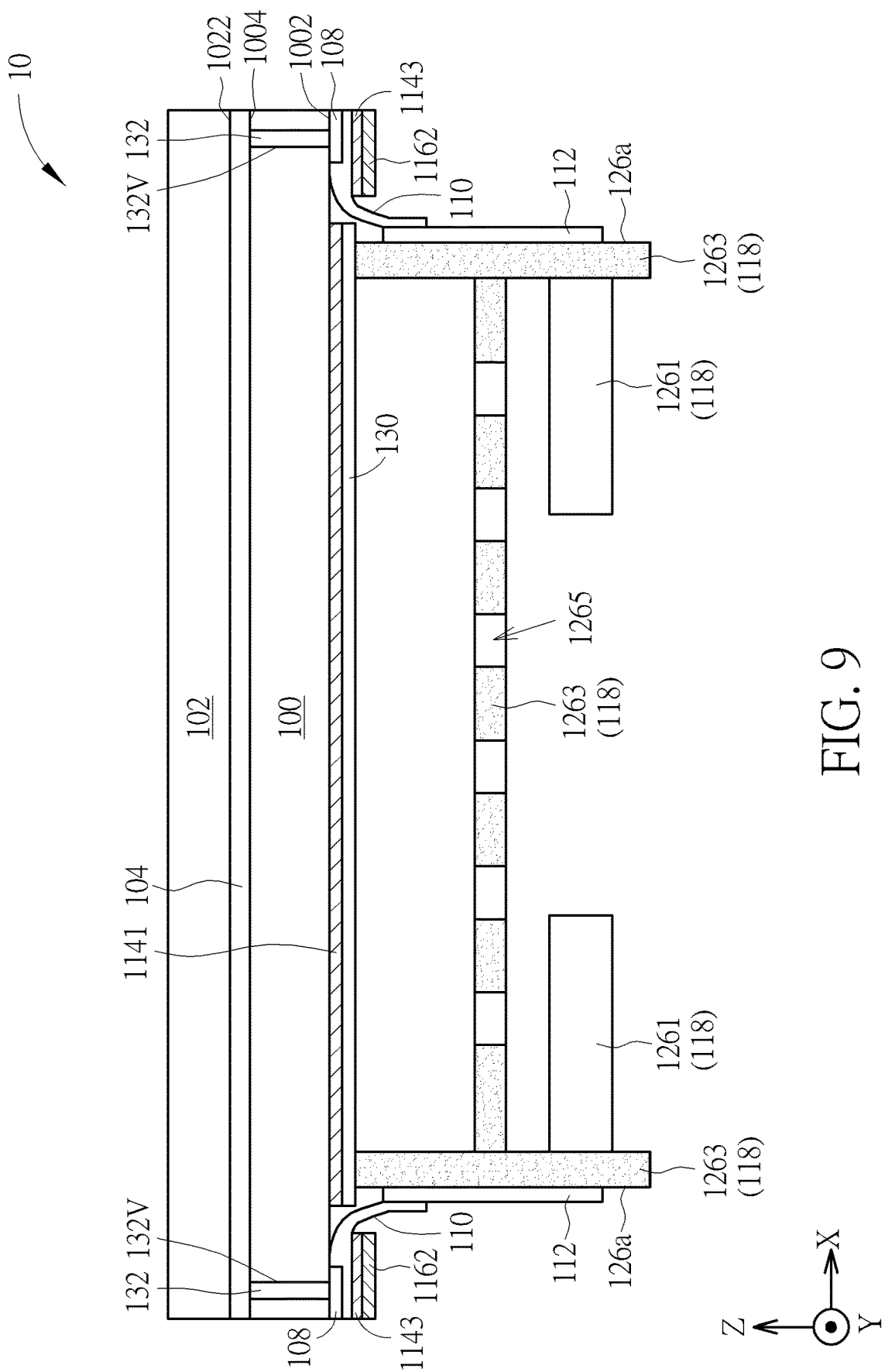
FIG. 9 is a sectional-view schematic diagram of an electronic device of an eighth embodiment according to the present disclosure.

Please refer to FIG. 8, which is a sectional-view schematic diagram of an electronic device of a seventh embodiment according to the present disclosure. In some embodiments (as shown in FIG. 8 and FIG. 9), one or more wires 132 may penetrate through the substrate 100. In FIG. 8, the wires 132 may be disposed at the central part of the substrate 100, and the wires 132 may be connected to the adhesive layers 108 on the surface 1002 of the substrate 100 through contact holes 132V, and the adhesive layer 108 may be connected to one end of the flexible circuit element 110.

The thermal dissipation element 118 includes a fin heat sink 124p and a fin heat sink 124q disposed on two sides of the substrate 100 (in the reverse direction of the direction Z). The first thermal dissipation sheet may include a thermal dissipation sheet 1141 and two thermal dissipation sheets 1143 disposed on the surface 1002 of the substrate 100, and the thermal dissipation sheet 1141 may be disposed between two adhesive layers 108 in the direction X. One of the thermal dissipation sheets 1143 is disposed between the fin heat sink 124p and the substrate 100, and the other one of the thermal dissipation sheets 1143 is disposed between the fin heat sink 124q and the surface 1002 of the substrate 100. In addition, a thermal dissipation sheet 1165 (the second thermal dissipation sheet) may be disposed on the thermal dissipation sheet 1141.

Another end of the flexible circuit element 110 may be connected to a driving circuit board 112. One of the driving circuit boards 112 may be disposed on the side surface 124a on the right side of the fin heat sink 124p along the direction X, and another one of the driving circuit boards 112 may be disposed on the side surface 124a on the left side of the fin heat sink 124q along the direction X. The driving circuit board 112 is not limited to being directly in contact with the side surface 124a, and the driving circuit board 112 may be hung on the side surface 124a without being directly in contact with the side surface 124a.

In addition, a thermal dissipation pad 122 may be disposed between the fin heat sink 124p and the flexible circuit element 110 on the substrate 100 (in the reverse direction of the direction Z), and another thermal dissipation pad 122 may be disposed between the fin heat sink 124q and another flexible circuit element 110 on the substrate 100 (in the reverse direction of the direction Z). The thermal dissipation pads 122 may increase the adhesive force of the fin heat sinks. The thermal dissipation element 118 in FIG. 8 is not limited to the fin heat sinks, and may include thermal dissipation elements in other embodiments.

Please refer to FIG. 9, which is a sectional-view schematic diagram of an electronic device of an eighth embodiment according to the present disclosure. The difference between this embodiment and the seventh embodiment (as shown in FIG. 8) is that the wires 132 of this embodiment may be disposed close to the edges of the substrate 100 and may penetrate through the substrate 100. In detail, the wires 132 may be disposed close to the edges of the substrate 100 and connected to the adhesive layers 108 on the surface 1002 of the substrate 100 through the contact holes 132V, and the wire 132 may be electrically connected to one end of a flexible circuit device 110 by the adhesive layer 108. The wire 132 may be disposed differently according to the product requirements, and not limited to the above. The material of the wires 132 may be substantially the same as the material of the traces 106, but not limited herein.

The first thermal dissipation sheet may include a thermal dissipation sheet 1141 and two thermal dissipation sheets 1143, and the second thermal dissipation sheet may include two thermal dissipation sheets 1162. The thermal dissipation sheet 1141 may be disposed on the surface 1002 of the substrate 100 (in the reverse direction of the direction Z), and the thermal dissipation sheet 1141 may be disposed between two flexible circuit elements 110 in the direction X. The thermal dissipation sheets 1143 and the thermal dissipation sheets 1162 may be disposed on the flexible circuit element 110 (in the reverse direction of the direction Z), and the thermal dissipation sheet 1143 may be disposed between the thermal dissipation sheet 1162 and the flexible circuit element 110.

The thermal dissipation element 118 may include a bracket 1263 and two fans 1261 disposed on the bracket 1263, and the bracket 1263 may include a plurality of openings 1265. The bracket 1263 and the fan 1261 may at least partially overlap the thermal dissipation sheet 1141 along the direction Z. In addition, another end of the flexible circuit element 110 may be connected to a driving circuit board 112, and the driving circuit board 112 may be disposed on the side surface 126a of the bracket 1263 along the direction X. In addition, the electronic device 10 may optionally include a metal film 130 disposed between the thermal dissipation sheet 1141 and the bracket 1263, wherein the metal film 130 may provide the function of thermal conduction or thermal dissipation.

As shown in FIG. 9, the wires 132 is disposed close to the edges of the substrate 100, and the wires 132 may be connected to the adhesive layers 108 on the surface 1002 of the substrate 100 (in the reverse direction of the direction Z) through the contact holes 132V. Therefore, the area or volume of the thermal dissipation sheet 1141 and the bracket 1263 on the surface 1002 may be increased, the number of the fans 1261 may be increased, and the heat generated by the electronic device 10 may be removed more effectively. The thermal dissipation element 118 in FIG. 9 is not limited to the bracket and the fans, and may include thermal dissipation elements in other embodiments.

From the above description, in the electronic device of the present disclosure, the first thermal dissipation sheet, the second thermal dissipation sheet and the thermal dissipation element may be disposed on the surface of the substrate (in the reverse direction of the direction Z). The first thermal dissipation sheet may be adhesive and may include thermal dissipative particles. The second thermal dissipation sheet may include a foil or a film of metal or graphite. The thermal dissipation element may include at least one metal bulk, a graphite bulk, a fin heat sink or a bracket having a fan. The first thermal dissipation sheet may cover most of the surface of the substrate, and the second thermal dissipation sheet or the thermal dissipation element can be fixed to the surface of the substrate by the first thermal dissipation sheet, and thus the air gap between contact surfaces may be reduced, so that the first thermal dissipation sheet may effectively conduct the heat generated by the electronic device uniformly, and the first thermal dissipation sheet may conduct the heat to the thermal dissipation element and the second thermal dissipation sheet in the vertical direction, wherein the second thermal dissipation sheet may conduct the heat to the thermal dissipation element in the lateral direction. Therefore, the heat generated by the electronic device may be effectively removed by the thermal dissipation element, the decrease of the lifetime of the light emitting elements may be mitigated, and the brightness reduction or non-uniform brightness of the electronic device may further be mitigated. The electronic device of the present disclosure may be a unit in a tiled electronic device, and the electronic device may be used to be coupled to another electronic device in a side-by-side manner.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device for coupling to another electronic device in a side-by-side manner, comprising:
    a substrate comprising a first surface and a second surface opposite to the first surface;
    a first thermal dissipation sheet disposed on the first surface, wherein the first thermal dissipation sheet comprises a first sub-thermal dissipation sheet, a second sub-thermal dissipation sheet and a third sub-thermal dissipation sheet, and the first sub-thermal dissipation sheet is disposed between the second sub-thermal dissipation sheet and the third sub-thermal dissipation sheet; and
    a thermal dissipation element disposed on the substrate, wherein the first thermal dissipation sheet is disposed between the thermal dissipation element and the substrate, and the thermal dissipation element at least partially overlaps the first thermal dissipation sheet,
    wherein the thermal dissipation element comprises a bracket having a fan, and the first sub-thermal dissipation sheet is disposed between the bracket and the substrate.

2. The electronic device according to claim 1, wherein the first thermal dissipation sheet has a first projection image on the first surface, and a ratio of an area of the first projection image to an area of the first surface of the substrate is greater than or equal to 0.7 and less than or equal to 1.

3. The electronic device according to claim 1, further comprising a second thermal dissipation sheet, wherein the first thermal dissipation sheet is disposed between the second thermal dissipation sheet and the substrate, and a thermal conductivity coefficient of the first thermal dissipation sheet is different from a thermal conductivity coefficient of the second thermal dissipation sheet.

4. The electronic device according to claim 3, wherein the thermal conductivity coefficient of the second thermal dissipation sheet is greater than the thermal conductivity coefficient of the first thermal dissipation sheet.

5. The electronic device according to claim 3, wherein the second thermal dissipation sheet has a second projection image on the first surface, and a ratio of an area of the second projection image to an area of the first surface of the substrate is greater than or equal to 0.2 and less than or equal to 0.7.

6. The electronic device according to claim 3, wherein the second thermal dissipation sheet is disposed between the thermal dissipation element and the first thermal dissipation sheet.

7. The electronic device according to claim 3, wherein the second thermal dissipation sheet comprises a fourth sub-thermal dissipation sheet and a fifth sub-thermal dissipation sheet, the fourth sub-thermal dissipation sheet and the fifth sub-thermal dissipation sheet are disposed on two sides of the first sub-thermal dissipation sheet and partially overlap the first sub-thermal dissipation sheet.

8. The electronic device according to claim 7, wherein the thermal dissipation element comprises a first metal bulk and a second metal bulk, the second sub-thermal dissipation sheet is disposed between the first metal bulk and the substrate, and the third sub-thermal dissipation sheet is disposed between the second metal bulk and the substrate.

9. The electronic device according to claim 8, wherein a portion of the fourth sub-thermal dissipation sheet is disposed between the first metal bulk and the first sub-thermal dissipation sheet, and a portion of the fifth sub-thermal dissipation sheet is disposed between the second metal bulk and the first sub-thermal dissipation sheet.

10. The electronic device according to claim 8, wherein the thermal dissipation element further comprises a third metal bulk, the first sub-thermal dissipation sheet is disposed between the third metal bulk and the substrate, and the third metal bulk at least partially overlaps the first sub-thermal dissipation sheet.

11. The electronic device according to claim 10, wherein a portion of the fourth sub-thermal dissipation sheet is disposed between the third metal bulk and the first sub-thermal dissipation sheet, and a portion of the fifth sub-thermal dissipation sheet is disposed between the third metal bulk and the first sub-thermal dissipation sheet.

12. The electronic device according to claim 8, wherein the thermal dissipation element further comprises a fin heat sink, the first sub-thermal dissipation sheet is disposed between the fin heat sink and the substrate, and the fin heat sink at least partially overlaps the first sub-thermal dissipation sheet.

13. The electronic device according to claim 8, wherein the thermal dissipation element further comprises a fourth metal bulk, a fifth metal bulk and a thermal dissipation medium disposed between the fourth metal bulk and the fifth metal bulk, the first sub-thermal dissipation sheet is disposed between the fourth metal bulk and the substrate, between the thermal dissipation medium and the substrate, and between the fifth metal bulk and the substrate.

14. The electronic device according to claim 13, wherein the second thermal dissipation sheet further comprises a sixth sub-thermal dissipation sheet disposed between the thermal dissipation medium and the first surface of the substrate.

15. The electronic device according to claim 1, wherein the thermal dissipation element further comprises at least one metal bulk.

16. The electronic device according to claim 1, further comprising:
- a driving circuit board disposed on the thermal dissipation element;
- a flexible circuit element disposed on the substrate; and
- a trace disposed on the first surface of the substrate or a side surface of the substrate, wherein the side surface is connected to the first surface and the second surface,
- wherein the driving circuit board and the trace are electrically connected by the flexible circuit element.

17. The electronic device according to claim 1, further comprising:
- a driving circuit board disposed on the thermal dissipation element;
- a flexible circuit element disposed on the first surface of the substrate; and
- a wire penetrating through the substrate,
- wherein the driving circuit board and the wire are electrically connected by the flexible circuit element.

18. The electronic device according to claim 1, wherein the first thermal dissipation sheet comprises a plurality of thermal dissipative particles.

19. The electronic device according to claim 1, wherein the second thermal dissipation sheet comprises a fourth sub-thermal dissipation sheet disposed between the first sub-thermal dissipation sheet and the bracket, or the electronic device further comprises a metal film disposed between the first sub-thermal dissipation sheet and the bracket.

* * * * *